(12) United States Patent
Rasheed et al.

(10) Patent No.: US 9,343,274 B2
(45) Date of Patent: *May 17, 2016

(54) PROCESS KIT SHIELD FOR PLASMA ENHANCED PROCESSING CHAMBER

(71) Applicant: APPLIED MATERIALS, INC., Santa Clara, CA (US)

(72) Inventors: Muhammad Rasheed, San Jose, CA (US); Donny Young, Cupertino, CA (US); Kirankumar Savandaiah, Karnataka (IN); Uday Pai, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/178,146

(22) Filed: Feb. 11, 2014

(65) Prior Publication Data

US 2014/0158049 A1 Jun. 12, 2014

Related U.S. Application Data

(62) Division of application No. 13/436,133, filed on Mar. 30, 2012, now Pat. No. 8,647,485.

(51) Int. Cl.
| | |
|---|---|
| *C23C 14/56* | (2006.01) |
| *C23C 14/34* | (2006.01) |
| *C23C 16/44* | (2006.01) |
| *C23C 14/35* | (2006.01) |
| *H01J 37/34* | (2006.01) |

(Continued)

(52) U.S. Cl.
CPC .............. *H01J 37/3411* (2013.01); *C23C 14/34* (2013.01); *C23C 14/35* (2013.01); *C23C 14/564* (2013.01); *H01J 19/54* (2013.01); *H01J 37/32495* (2013.01); *C23C 16/44* (2013.01); *Y10T 428/12528* (2015.01)

(58) Field of Classification Search
CPC ............ H01J 37/3441; H01J 37/32495; H01J 37/3411; H01J 19/54; C23C 14/34; C23C 16/44; C23C 14/564
See application file for complete search history.

(56) References Cited

U.S. PATENT DOCUMENTS

| | | |
|---|---|---|
| 5,605,866 A | 2/1997 | McClanahan et al. |
| 5,690,795 A | 11/1997 | Rosenstein et al. |

(Continued)

OTHER PUBLICATIONS

'Seal' definition. Merriam-Websters Online Dictionary. [http://www.merriam-webster.com/dictionary/seal] [Accessed on Apr. 26, 2013].

*Primary Examiner* — Michael Band
(74) *Attorney, Agent, or Firm* — Moser Taboada; Alan Taboada

(57) ABSTRACT

Apparatus for processing substrates is disclosed herein. In some embodiments, an apparatus includes a first shield having a first end, a second end, and one or more first sidewalls disposed between the first and second ends, wherein the first end is configured to interface with a first support member of a process chamber to support the first shield in a position such that the one or more first sidewalls surround a first volume of the process chamber; and a second shield having a first end, a second end, and one or more second sidewalls disposed between the first and second ends of the second shield and about the first shield, wherein the first end of the second shield is configured to interface with a second support member of the process chamber to support the second shield such that the second shield contacts the first shield to form a seal therebetween.

9 Claims, 4 Drawing Sheets

(51) Int. Cl.
*H01J 37/32* (2006.01)
*H01J 19/54* (2006.01)

(56) References Cited

U.S. PATENT DOCUMENTS

| | | | |
|---|---|---|---|
| 5,763,851 A | 6/1998 | Forster et al. | |
| 6,190,513 B1 | 2/2001 | Forster et al. | |
| 6,228,229 B1 * | 5/2001 | Raaijmakers et al. | 204/192.12 |
| 6,254,737 B1 | 7/2001 | Edelstein et al. | |
| 6,254,746 B1 | 7/2001 | Subramani et al. | |
| 6,287,435 B1 * | 9/2001 | Drewery et al. | 204/298.09 |
| 6,297,595 B1 | 10/2001 | Stimson et al. | |
| 6,712,909 B2 | 3/2004 | Tometsuka | |
| 7,048,837 B2 | 5/2006 | Somekh et al. | |
| 7,182,816 B2 * | 2/2007 | Kleshock et al. | 118/715 |
| 7,244,344 B2 | 7/2007 | Brown et al. | |
| 7,569,125 B2 | 8/2009 | Gung et al. | |
| 7,713,390 B2 | 5/2010 | Golubovsky | |
| 2007/0116873 A1 * | 5/2007 | Li et al. | 427/248.1 |

* cited by examiner

US 9,343,274 B2

PROCESS KIT SHIELD FOR PLASMA ENHANCED PROCESSING CHAMBER

CROSS-REFERENCE TO RELATED APPLICATIONS

This application is a divisional of co-pending U.S. Pat. No. 8,647,485 issued on Feb. 11, 2014, which is herein incorporated by reference.

FIELD

Embodiments of the present invention generally relate to plasma-enhanced substrate processing systems.

BACKGROUND

In plasma enhanced substrate processing systems, such as physical vapor deposition (PVD) chambers, process kits may be utilized to prevent undesired deposition on one or more chamber components. In some embodiments, a process kit may include a shield, such as a two piece shield, where a first shield surrounds a volume between a sputtering target and a substrate support and a second shield surrounds a source material of the target. The inventors have discovered that adjacent surfaces between the first and second shields can be a site for the undesired deposition of source material from the target. For example, the source material can flake off the adjacent surfaces and contaminate the substrate on which source material is being deposited. Further, the inventor's have discovered that misalignment between any of the aforementioned shield components and the target can result in arcing between RF hot and grounded surfaces and/or non-uniformities in sputtering and deposition of the source materials.

Accordingly, the inventors have provided improved process kit shields for use in plasma enhanced processing systems.

SUMMARY

Apparatus for processing substrates are provided herein. In some embodiments, the apparatus includes a process kit comprising a first shield having a first end, a second end, and one or more first sidewalls disposed between the first and second ends, wherein the first end is configured to interface with a first support member of a process chamber to support the first shield in a position such that the one or more first sidewalls surround a first volume of an inner volume of a process chamber, and wherein the one or more first sidewalls are configured to surround a substrate support disposed in the process chamber; and a second shield having a first end, a second end, and one or more second sidewalls disposed between the first and second ends of the second shield and about the first shield, wherein the first end of the second shield is configured to interface with a second support member of the process chamber to support the second shield in a position such that the second shield contacts the first shield to form a seal therebetween, and wherein the second end of the second shield is configured to support a first ring disposed about a support surface of the substrate support.

In some embodiments, the apparatus includes substrate processing system comprising a process chamber having a chamber wall; a substrate support disposed within the process chamber and having a substrate support surface; a chamber lid moveable from a closed position disposed atop an upper end of the chamber wall to an open position; a first shield having a first end coupled to the chamber lid, a second end, and one or more first sidewalls disposed between the first and second ends; a processing volume defined by the chamber lid, the one or more first sidewalls and the substrate support surface when the chamber lid is in the closed position; and a second shield having a first end coupled an inner surface of the chamber wall, a second end, and one or more second sidewalls disposed between the first and second ends of the second shield and about the first shield, wherein the second end of the second shield is configured to be disposed about the substrate support and contacts the second end of the first shield to form a seal therebetween when the chamber lid is in the closed position.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
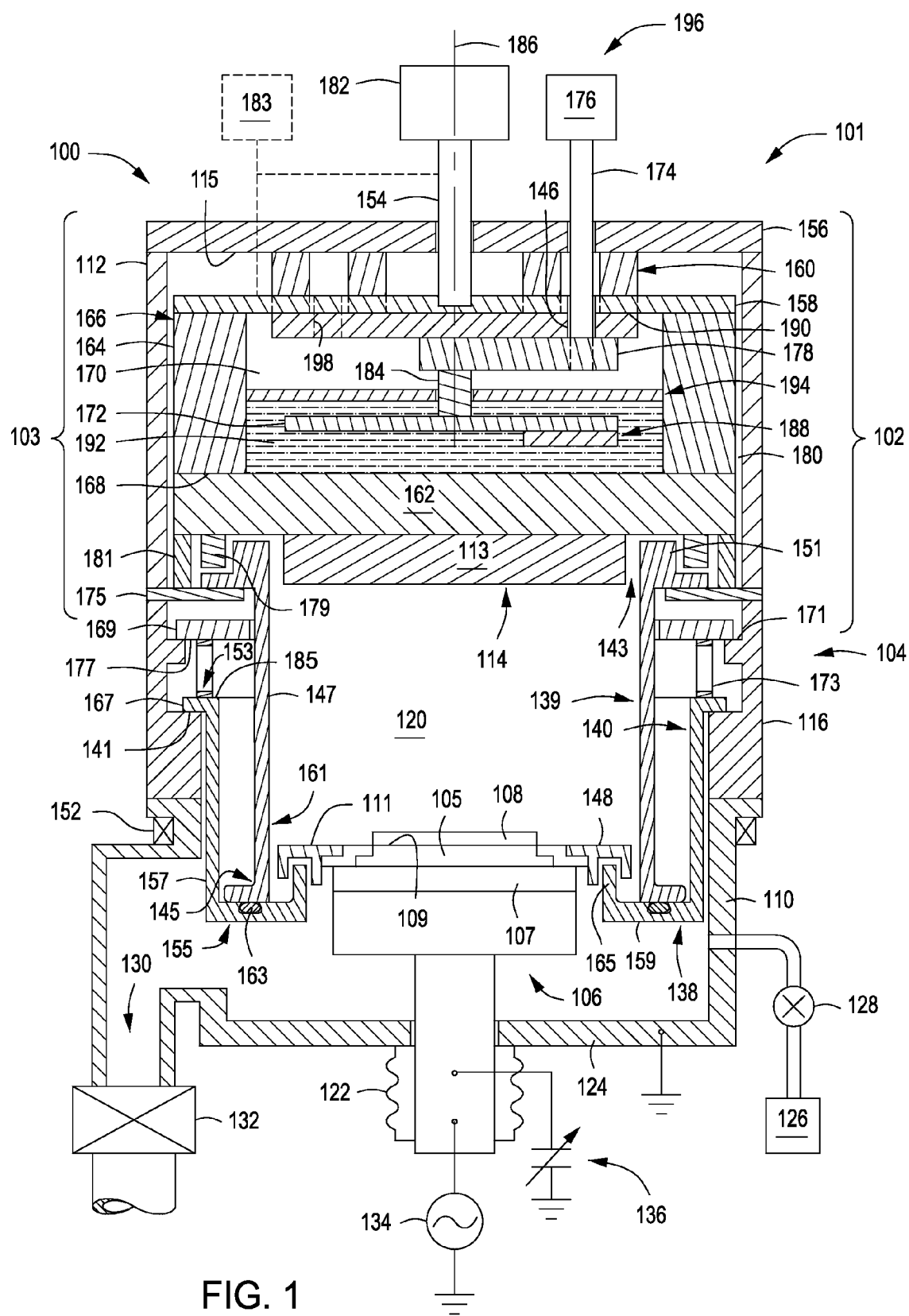
FIG. 1 depicts a schematic cross sectional view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The present invention provides improved process kit shield designs that may be utilized with a range of RF frequencies and/or source materials for sputter deposition in a PVD chamber or in other plasma enhanced substrate processing systems. Embodiments of the process kit shields of the present invention may advantageously reduce or prevent arcing by providing improved grounding surfaces and/or means of alignment between the process kit and the source material. Further, embodiments of process kit shields of the present invention may advantageously reduce surfaces where undesired deposition of source material can occur. In addition, embodiments of process kit shields of the present invention may advantageously provide a more uniform RF return path for RF energy provided to the process chamber during use. Other and further advantages of the present invention are discussed below.

FIG. 1 depicts a simplified, cross-sectional view of a PVD chamber 100 in accordance with some embodiments of the present invention. Examples of PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufacturers, including those configured for other types of processing besides PVD, may also benefit from modifications in accordance with the teachings disclosed herein.

In some embodiments of the present invention, the PVD chamber 100 includes a chamber lid 101 removably disposed atop a process chamber 104. The chamber lid 101 may be moveable at least from a closed position, as illustrated in FIG. 1, to an open position, as illustrated in FIG. 4B. The chamber lid 101 may include a target assembly 102 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber lid 101 such that an RF return path is provided to an RF power source 182 disposed above the chamber lid 101. Other RF return paths are also provided, such as those that travel from a plasma in the process chamber and/or from the substrate support 106 via a process kit shield (e.g., a shield 138 as discussed below) and ultimately back to the grounding assembly 103 of the chamber lid 101. The RF power source 182 may provide RF power to the target assembly 102 as discussed below.

The substrate support 106 has a material-receiving surface facing a principal surface of a target 114 and supports the substrate 108 to be sputter coated in planar position opposite to the principal surface of the target 114. The substrate support 106 may include a dielectric member 105 having a substrate processing surface 109 for supporting the substrate 108 thereon. In some embodiments, the substrate support 108 may include one or more conductive members 107 disposed below the dielectric member 105. For example, the dielectric member 105 and the one or more conductive members 107 may be part of an electrostatic chuck, RF electrode, or the like which may be used to provide chucking or RF power to the substrate support 106.

The substrate support 106 may support the substrate 108 in a first volume 120 of the process chamber 104. The first volume 120 may be a portion of the inner volume of the process chamber 104 that is used for processing the substrate 108 (e.g., a processing volume) and may be separated from the remainder of the inner volume (e.g., a non-processing volume) during processing of the substrate 108. The first volume 120 is defined as the region above the substrate support 106 during processing (for example, between the target 114, the shield 138, and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

Figure 2:
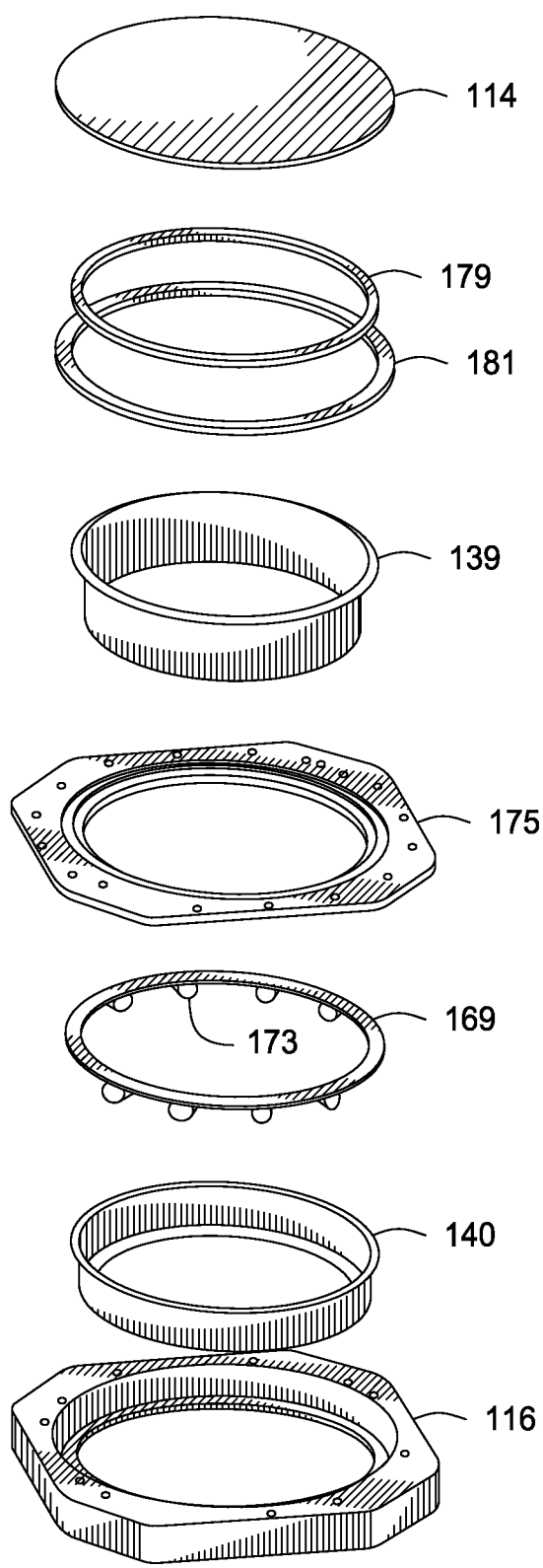
FIG. 2 depicts an exploded schematic view of a process kit in relation to components of a process chamber.
Figure 3:
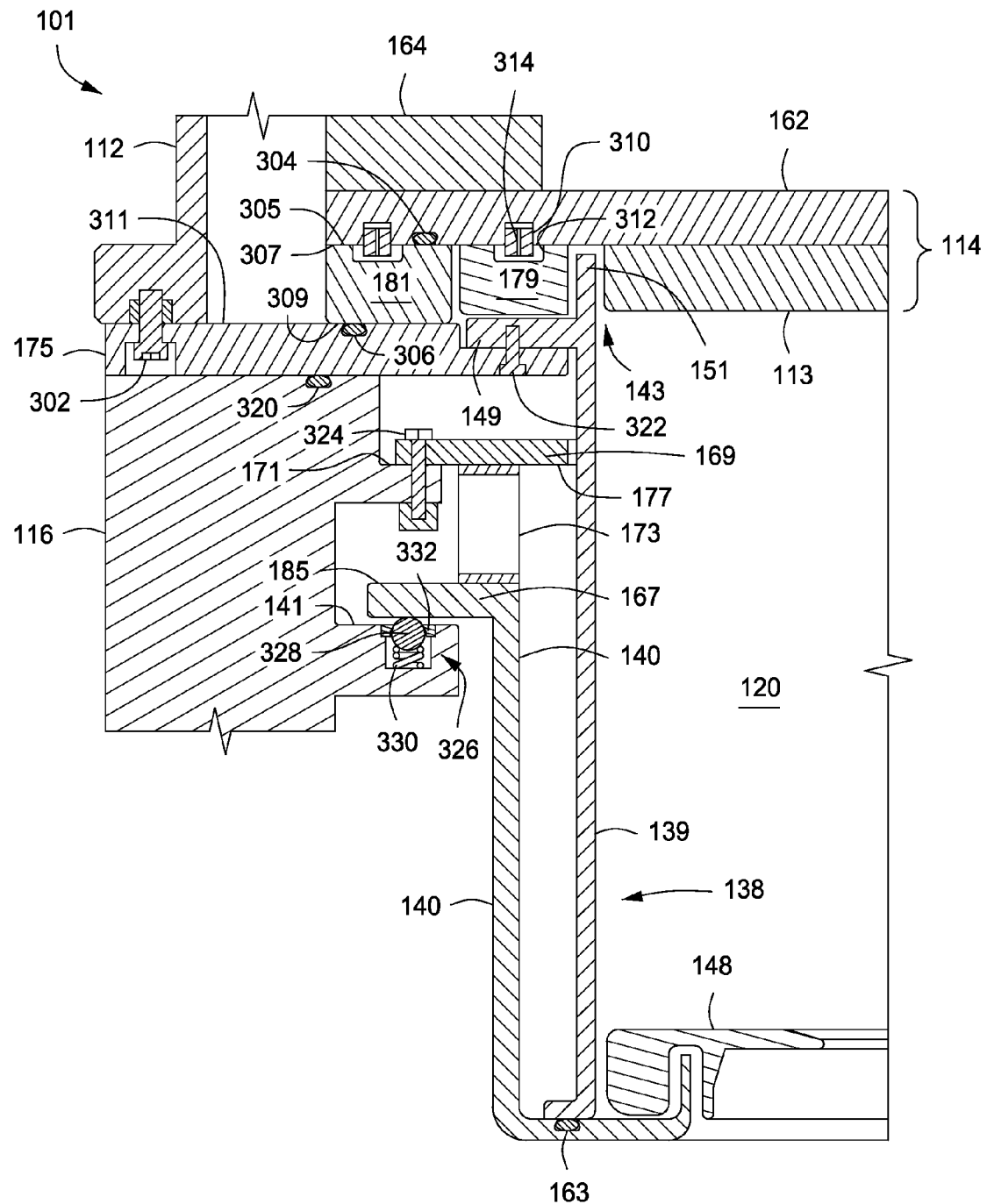
FIG. 3 depicts a partial sectional view of a support member of a process chamber lid and surrounding structure in accordance with some embodiments of the present invention.

As illustrated in FIGS. 1-3, the system 100 further includes a process kit shield, or shield, 138 to surround the processing volume, or central region, of the process chamber 104 and to protect other chamber components from damage and/or contamination from processing. In some embodiments, the shield 138 may include a first shield 139 and a second shield 140. For example, as illustrated in FIG. 1, the first shield 139 may be supported by a first support member of the system 100 such as a support member 175 of the chamber lid 101 and the second shield 140 may be supported by a second support member of the system 100 such as a first ledge 141 disposed on an inner surface of an upper grounded enclosure wall 116 of the process chamber 104. As illustrated in FIG. 1, second shield 140 may rest on the first ledge 141 of the upper grounded enclosure wall 116. Similar to the lower grounded enclosure wall 110, the upper grounded enclosure wall 116 may provide a portion of the RF return path between the lower grounded enclosure wall 110 and the grounding assembly 103 of the chamber lid 101. However, other RF return paths are possible, such as via the grounded shield 138.

The first shield 139 extends downwardly and includes a first end 143, a second end 145, and one or more first sidewalls 147 disposed between the first and second ends 143, 145. The one or more sidewalls 147 may be generally tubular and having a generally constant diameter that generally surrounds the first volume 120. The first shield 139 extends along the walls of the upper grounded enclosure wall 116 and the lower grounded enclosure wall 110 downwardly in a spaced apart relation therefrom to below a top surface of the substrate support 106.

The first end 143 of the first shield may further include a first lip 149 extending radially outward from the one or more first sidewalls 147, wherein the second lip is configured to interface with the first ledge 141 of the upper grounded enclosure wall 116. The first end 143 may further include a first protrusion 151 extending from the one or more first sidewalls 147 in a direction that opposes the first volume 120. The first protrusion 151 may be configured to be disposed about a source material 113 of the target 114 as illustrated in FIG. 1. The first protrusion 151 may be concentrically disposed about the source material 113.

The second shield 140 may extend downward from the first ledge 141 and include a first end 153, a second end 155, and one or more second sidewalls 157 disposed between the first and second ends 153, 155. The one or more second sidewalls 157 may be disposed about a portion of the first shield 139, for example, such as the portion of the one or more first sidewalls 147 disposed proximate the height of the first ledge 141 and extending downward. In a closed position of the chamber lid 101 as illustrated in FIG. 1, the second end 155 of the second shield 140 contacts the first shield at corresponding second end 145 to form a seal therebetween, which is discussed in more detail below.

The second end 155 of the second shield 140 may include a second lip 159 extending inward from the one or more second sidewalls 157 and beyond a first volume facing side 161 of the one or more first sidewalls 147. The second lip 159 may contact the second end 145 of the first shield 139 to form the seal when the chamber lid 101 is in the closed position. For example, a compressible element 163 may be disposed between the second end 145 of the first shield 139 and the second lip 159 to form the seal when the chamber lid is in the closed position. For example, the compressible element 163 may include a gasket, or the like.

The second end 155 of the second shield 140 may include a second protrusion 165 extending towards the first volume 120 from an inner end of the second lip 159. For example, the second end 155 including the second lip 159 and second protrusion 165 may resemble a u-shape or another similar shape. A cover ring 148 (e.g., a first ring) may rest on the top of the second protrusion 165 when the substrate support 106 is in its lower, loading position but rests on the outer periphery of the substrate support 106 when it is in its upper, deposition position to protect the substrate support 106 from sputter deposition. An additional deposition ring 111 may be used to shield the periphery of the substrate support 106 from deposition.

The first end 153 of the second shield 140 may further include a third lip 167 extending radially outward from the one or more second sidewalls 157. The third lip 167 may couple the second shield 140 to the first ledge 141.

The process kit shield 138 may include a second ring 169 disposed above the third lip 167 of the second shield 140 and about the first shield 139 as illustrated in FIG. 1. The second ring 169 may be configured to be coupled to a third support member disposed between the first and second support members, e.g., the first ledge 141 and the support member 175, when the chamber lid 101 is in a closed position. For example, the third support member may be a second ledge 171 disposed on the inner surface of the upper grounded enclosure wall 116. The second ledge 171 may support the second ring 169.

A plurality of conductive elements 173 may be disposed on a third lip facing side 177 of the second ring 169. The plurality of conductive elements 173 may be configured to contact a second ring facing side 185 of the third lip 167. The plurality of conductive elements may advantageously provide a robust grounding surface between the third lip 167 and the second ring 169, which may facilitate reduced arcing between RF hot and grounded surfaces and/or facilitate a broader range of frequencies and/or source material 113 that may be utilized with the process kit shield 138. Each conductive element 173 may be in the shape of a loop or the like as illustrated in FIG. 2. In some embodiments, as shown in FIG. 2, the plurality of conductive elements 173 may be symmetrically disposed about the second ring 169.

Returning to FIG. 1, and in some embodiments, a magnet 152 may be disposed about the process chamber 104 for selectively providing a magnetic field between the substrate support 106 and the target 114. For example, as shown in FIG. 1, the magnet 152 may be disposed about the outside of the chamber wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 having a first surface 115 that may be generally parallel to and opposite a backside of the target assembly 102. A grounding shield 112 may extending from the first surface 115 of the grounding plate 156 and surround the target assembly 102. The grounding assembly 103 may include a support member 175 to support the target assembly 102 within the grounding assembly 102.

In some embodiments, the support member 175 may be coupled to a lower end of the grounding shield 112 proximate an outer peripheral edge of the support member 175 and extends radially inward to support a seal ring 181, the target assembly 102, the first shield 139 and optionally, an isolator ring 179. The seal ring 181 may be a ring or other annular shape having a desired cross-section. The seal ring 181 may include two opposing planar and generally parallel surfaces to facilitate interfacing with the target assembly 102, such as the backing plate 162, on a first side of the seal ring 181 and with the support member 175 on a second side of the seal ring 181. The seal ring 181 may be made of a dielectric material, such as ceramic. The seal ring 181 may insulate the target assembly 102 from the ground assembly 103.

The isolator ring 179 is generally disposed about the first protrusion 151 at the first end 143 of the first shield 139. In some embodiments, the seal ring 181 is disposed adjacent to an outer edge of the isolator 179 (i.e., radially outward of the isolator ring 179). In some embodiments, the isolator ring 179 is made of a dielectric material, such as a ceramic.

The support member 175 may be a generally planar member having a central opening to accommodate the first shield 139 and the target 114. In some embodiments, the support member 175 may be circular, or disc-like in shape, although the shape may vary depending upon the corresponding shape of the chamber lid and/or the shape of the substrate to be processed in the process processing system 100. In use, when the chamber lid 101 is opened or closed, the support member 175 maintains the first shield 139 in proper alignment with respect to the target 114, thereby minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may comprise a source material 113 to be deposited on a substrate, such as the substrate 108 during sputtering, such as a metal, metal oxide, metal alloy, or the like. In some embodiments, the target 114 may include a backing plate 162 to support the source material 113. The source material 113 may be disposed on a substrate support facing side of the backing plate 162 as illustrated in FIG. 1. The backing plate 162 may comprise a conductive material, such as copper-zinc, copper-chrome, or the same material as the target, such that RF and DC power can be coupled to the source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196 as discussed below. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid 192, such as water ($H_2O$) or the like. In some embodiments, a divider 194 may be provided to contain the cooling fluid 192 in a desired portion of the cavity 170 (such as a lower portion, as shown) and to prevent the cooling fluid 192 from reaching components disposed on the other side of the divider 194, as discussed below.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between 5 mm and 40 mm.

The grounding assembly 103 and the target assembly 102 may be electrically separated by the seal ring 181 and by one or more of insulators 160 disposed between the first surface 115 of the grounding plate 156 and the backside of the target assembly 102, e.g., a non-target facing side of the source distribution plate 158.

For example, FIG. 3 depicts a more detailed view of the support member 175 and surrounding structure of the process processing system 100 of FIG. 1. In some embodiments, the support member 175 is coupled to the lower side of the grounding shield 112 proximate an outer periphery of the support member 175. In some embodiments, the support member 175 is coupled to the grounding shield 112 by a plurality of fasteners 302 such as bolts, or the like.

When coupled to the grounding shield 112, the support member 175 may facilitate forming a seal between portions of the process processing system 100 that are not held at vacuum (such as within the lid) and portions of the processing system 100 that may be held at vacuum (such as within the interior of the process chamber 104). For example, a first compressible element 304 may be disposed between a first side 305 of the seal ring 181 and a lower surface 307 of the target assembly 102 (e.g., the substrate support facing side of the backing plate 162). A second compressible element 306 may be disposed between a second surface 309 of the seal ring 181 and an upper surface 311 of the support member 175 such that when sufficient force is applied to compress the first and second compressible elements 304, 306 a vacuum seal is formed at those locations. The first and second compressible elements 304, 306, as well as other compressible elements discussed herein, may be any suitable material to provide a seal, such as an o-ring, a gasket, or the like. In some embodiment, a third compressible element 320 may be provided between the support member 175 and the upper grounded enclosure wall 116 to provide a seal between a lower surface of the support member 175 and a support member facing surface of the upper grounded enclosure wall 116 when the chamber lid 101 is in a closed position atop the upper grounded enclosure wall 116 of the process chamber 104.

In some embodiments, alignment features may be provided to maintain a gap 308 between the inner wall of the isolator ring 179 and the outer edge of the source material 113 of the target 114. The alignment features may facilitate maintaining a more uniform gap between the isolator ring 179 and the source material 113. In some embodiments, the radial gap may be in the range of 0.003 to 0.030 inches, although other dimensions may be used depending upon the process chamber configuration and the processes to be performed in the process chamber. In some embodiments, a plurality of pins 310 may extend from a bottom surface of the backing plate 162. For example, the pins may be press fit or otherwise secured with corresponding holes formed in the backing plate 162. The pins 310 include portions that extend in a substantially normal direction from the bottom surface of the backing plate 162 to interface with, or fit into, a corresponding plurality of slots 312 disposed within a top surface of the isolator ring 179. In some embodiments, there are at least three sets of alignment features (e.g., three pins 310 and three slots 312) that prevent the side-to-side movement of the isolator ring 179 and the maintain the gap between the inner wall of the isolator ring 179 and the outer edge of the source material 113. The slots 312 may be radially aligned such that a radial length of the slot 312 is greater than the diameter of the pins 310 to facilitate relative movement of the isolator ring 179 and the backing plate 162 due to differences in rates of thermal expansion and contraction, while maintaining alignment between the isolator ring 179 and the backing plate 162. In some embodiments, each pin 310 may have a hollow passageway 314 disposed axially through the pin 310 to allow evacuation of gases trapped within the alignment features.

In some embodiments, one or more fasteners 322 may be provided to secure the first lip 149 of the first shield 139 to the support member 175. The first shield 139 may be coupled to the support member 175 such that the upper portion 143 of the first shield 139 is disposed in the gap between the isolator 179 and the source material 113 and maintained in a spaced apart relation to the source material 113 to avoid arcing. Similarly, one or more fasteners 324 may be provided to secure the second ring 169 to the second ledge 171. To the contrary, the second shield 140 may be secured at the third lip 167 via one or more biasing elements 326 disposed between the first ledge 141 and the third lip 167 to bias the second shield towards an upper end of the upper grounded enclosure wall. In one exemplary embodiment, the one or more biasing elements 326 include a ball 328 retained in a recess in the first ledge 141. A spring 330 may be disposed between the ball 328 and a bottom of the recess to bias the ball 328 away from the bottom of the recess. A retaining feature, such as a retaining ring 332 may be secured to the first ledge 141 to retain the ball 328 within the recess. The diameter of the retaining ring 332 may be selected to allow a desired portion of the ball 328 to extend from the recess and contact the third lip 167 of the second shield 140 while retaining the ball 328 within the recess of the first ledge 141. Furthermore, by allowing radial movement by moving over the balls 328, particle generation due to rubbing between components may be reduced or eliminated. In some embodiments, an alignment feature may be provided to facilitate radial alignment of the second shield 140 when disposed on the first ledge 141, similar to that as discussed above with respect to the isolator ring 179.

In operation, when the chamber lid 101 is moved from the open position to the closed position, the second end 145 of the first shield 139 contacts the second end 155 of the second shield 140 to form the seal. However, if the second shield 140 is rigidly coupled to the first ledge 141, then the chamber lid 101 may to reach a complete closed position as it may be restricted by the second shield 140 when contacted by the first shield 139. Accordingly, the one or more biasing elements 326 may be provided to allow some movement in the second shield 140 such that the chamber lid 101 can reach the complete closed position while providing an upward force in the direction of the chamber lid 101 such that the seal can still be formed between the second ends 145, 155 of the first and second shields 139, 140 respectively.

Figure 4A:
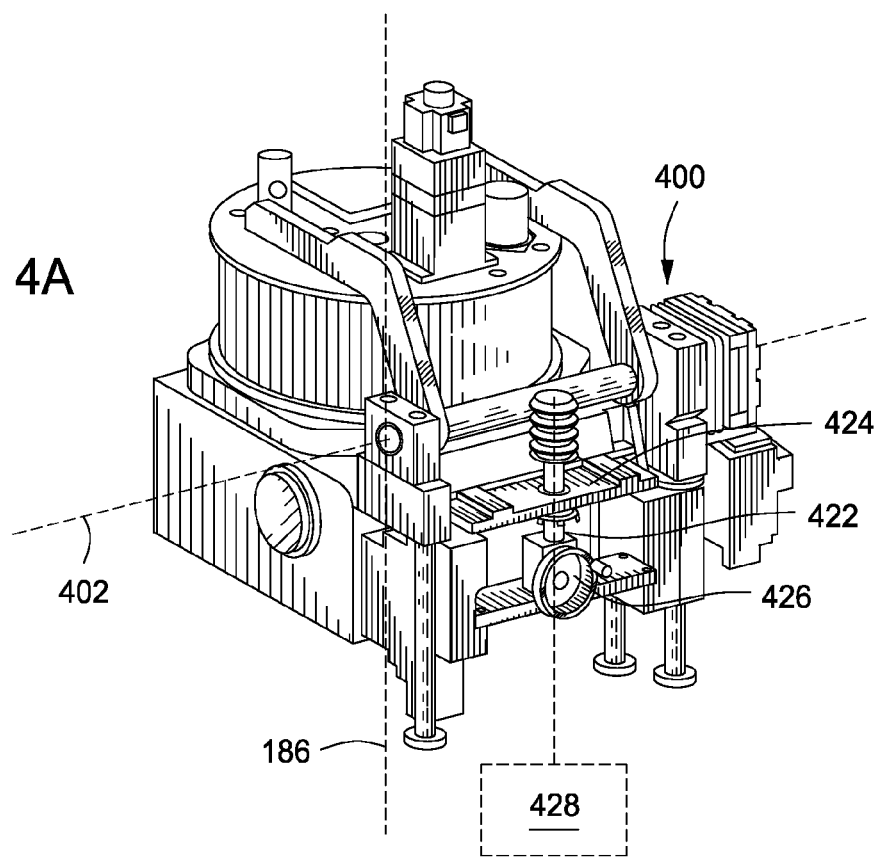
FIGS. 4A-B depict perspective and side schematic views of a chamber lid lift assembly in accordance with some embodiments of the present invention.
Figure 4B:
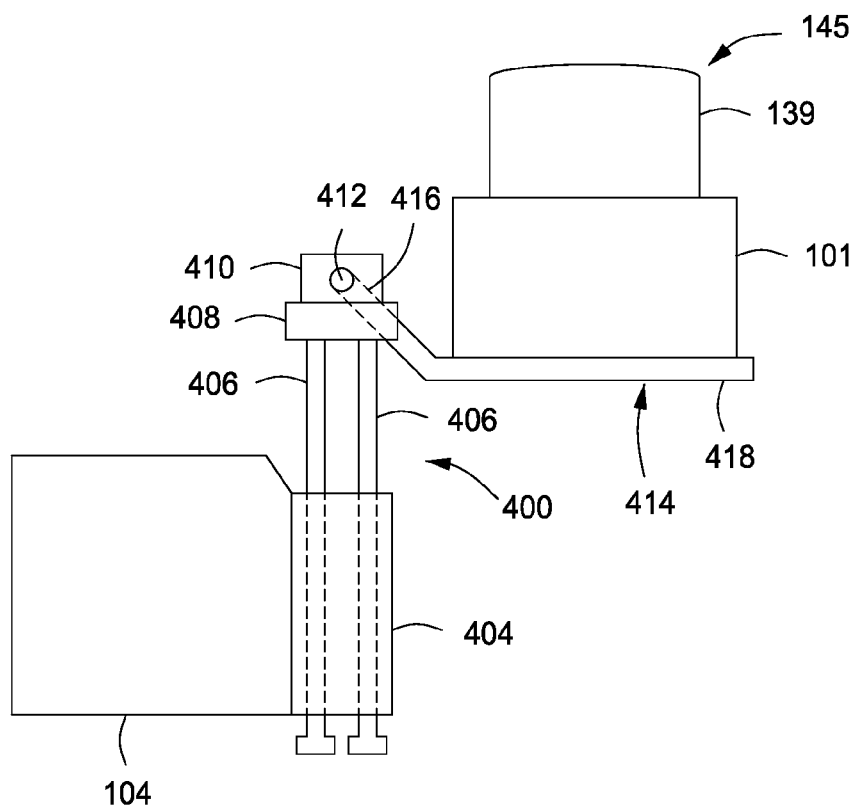

FIGS. 4A-B depict embodiments of a chamber lid lift assembly 400 in accordance with some embodiments of the present invention. The chamber lid lift assembly 400 couples to the process chamber 104 and chamber lid 101 to move the chamber lid 101 between the open and closed positions as illustrated in FIGS. 4A and 4B, respectively. The chamber lid lift assembly 400 may lift the chamber lid 101 along a central axis 186 of the process chamber 104 sufficient to raise the second end 145 of the first shield 139 to clear an upper end of the chamber wall (e.g., upper grounding enclosure wall 116) and rotates the chamber lid 101 about a horizontal axis 402 disposed perpendicularly to a central axis 186 of the process chamber 104 until the chamber lid 101 reaches the open position.

The chamber lid lift assembly 400 may include a plurality of linear guides 404 coupled to an external side of the chamber wall, wherein each linear guide 404 has one or more guide shafts 406 moveably coupled thereto, wherein each guide shaft 406 is moveable in a direction parallel to the central axis 186. As illustrated in the exemplary embodiments of FIGS. 4A-B, two linear guides 404 may be utilize at opposing corners of the external side of the chamber wall and four guide shafts 406 may be utilized, such as two guide shafts 406 to each linear guide 404.

A support plate 408 may be coupled to each guide shaft 406 and moveable therewith. In the exemplary embodiments illustrated in FIGS. 4A-B, a guide shaft 406 may be coupled to the support plate 408 proximate each corner of the support plate 408.

A plurality of blocks 410 may be disposed on a guide opposing surface of the support plate 408. A rotation shaft 412 may be moveably coupled to the plurality of blocks 410 such that the rotation shaft 412 rotates about the horizontal axis 402. A plurality of arms 414 may extend from the rotation shaft 412, wherein each arm 414 has a first end 416 fixedly coupled to the rotation shaft 412 and a second end 418 coupled to the chamber lid 101 such that rotation of the rotation shaft 412 causes the chamber lid 101 to rotate about the horizontal axis 402. A first motor 420 may be coupled to the rotation shaft 412 to rotate the rotation shaft about the horizontal axis 402.

One or more mechanisms may be utilized to facilitate movement of the guide shafts 406. For example, the assembly 400 may include a threaded shaft 422, such as a jack screw and any suitable threaded shaft, disposed between the plurality of linear guide shafts 406. A lift block 424 may be moveable coupled to the threaded shaft 422. For example, the lift block 424 may be coupled to the plate 408, or alternatively, may be part of the plate 408. In some embodiments, a wheel 426 may be coupled to the threaded shaft 422 to control the rotation of the threaded shaft 422 such that the chamber lid 101 is raised or lowered with respect to the upper end of the chamber wall. For example, the wheel may be mounted between the plurality of linear guides 404 as illustrated in FIG. 4A. Alternatively, the wheel may be replaced with a motor 428 coupled to the threaded shaft to control the rotation of the threaded shaft such that the chamber lid is raised or lowered with respect to the upper end of the chamber wall.

Returning to FIG. 1, the target assembly 102 has an RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158, discussed below). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the PVD chamber 100 (e.g., the electrode 154 may be coupled to the target assembly at a point coincident with a central axis of the target, which is coincident with the central axis 186). The electrode 154, aligned with the central axis 186 of the PVD chamber 100, facilitates applying RF energy from the RF source 182 to the target 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like.

The electrode 154 may pass through the grounding plate 156 and is coupled to a source distribution plate 158. The grounding plate 156 may comprise any suitable conductive material, such as aluminum, copper, or the like. The open spaces between the one or more insulators 160 allow for RF wave propagation along the surface of the source distribution plate 158. In some embodiments, the one or more insulators 160 may be symmetrically positioned with respect to the central axis 186 of the PVD chamber 100 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD chambers due, at least in part, to the central position of the electrode 154

One or more portions of a magnetron assembly 196 may be disposed at least partially within the cavity 170. The magnetron assembly provides a rotating magnetic field proximate the target to assist in plasma processing within the process chamber 104. In some embodiments, the magnetron assembly 196 may include a motor 176, a motor shaft 174, a gear box 178, a gearbox shaft 184, and a rotatable magnet (e.g., a plurality of magnets 188 coupled to a magnet support member 172).

In some embodiments, the magnetron assembly 196 is rotated within the cavity 170. For example, in some embodiments, the motor 176, motor shaft 174, gear box 178, and gearbox shaft 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. To the contrary, in embodiments of the present invention, the electrode 154 is aligned with the central axis 186 of the PVD chamber. As such, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as optical sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 172 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength.

Alternatively, the magnet support member 172 may be rotated by any other means with sufficient torque to overcome the drag caused on the magnet support member 172 and attached plurality of magnets 188, for example due to the cooling fluid 192, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider 194 is present. The motor 176 may be an electric motor, a pneumatic or hydraulic drive, or any other process-compatible mechanism that can provide the required torque.

While the foregoing is directed to embodiments of the present invention, other and further embodiments of the invention may be devised without departing from the basic scope thereof.

The invention claimed is:

1. A substrate processing system, comprising:
a process chamber having a chamber wall;
a substrate support disposed within the process chamber and having a substrate support surface;
a chamber lid moveable from a closed position disposed atop an upper end of the chamber wall to an open position;
a first shield having a first end coupled to and movable with the chamber lid, a second end, and one or more first sidewalls disposed between the first and second ends, wherein the one or more first sidewalls surround an upper portion of the substrate support when the chamber lid is in the closed position; and
a first volume defined by the chamber lid, the one or more first sidewalls and the substrate support surface when the chamber lid is in the closed position;
a second shield having a first end coupled to an inner surface of the chamber wall, a second end, and one or more second sidewalls disposed between the first and second ends of the second shield and about the first shield, wherein the second end of the second shield is configured to support a first ring disposed about the substrate support surface of the substrate support, and wherein the first end of the second shield is supported in a position such that the second shield contacts a compressible element between the second end of the first shield and the second shield to form a seal therebetween when the chamber lid is in the closed position, wherein the first end of the second shield further comprises a lip extending radially outward from the one or more second sidewalls, wherein the lip is coupled to a first ledge disposed on the inner surface of the chamber wall;
a second ring of the first shield is disposed above the lip of the second shield and about the first shield, wherein the second ring is disposed on a second ledge of the inner surface of the chamber wall; and
a plurality of conductive elements contacting a lip facing side of the second ring, wherein the plurality of conductive elements are configured to contact a second ring facing side of the lip to provide a robust grounding surface between the lip and the second ring.

2. The substrate processing system of claim 1, wherein the chamber lid further comprises:
a target having a source material such that the source material faces the first volume when the chamber lid is in the closed position; and
wherein the first end of the first shield further comprises:
a first lip extending radially outward from the one or more first sidewalls of the first shield, wherein the first lip is coupled to the chamber lid; and a first protrusion extending from the one or more first sidewalls in a direction that opposes the first volume, wherein the first protrusion is disposed about the source material of the target.

3. The substrate processing system of claim 2, wherein the second end of the second shield further comprises:
a second lip extending inward from the one or more second sidewalls and beyond a first volume facing side of the one or more first sidewalls, wherein the compressible element is disposed between the second lip and the second end of the first shield to form the seal; and
a second protrusion extending towards the first volume from an inner end of the second lip.

4. The substrate processing system of claim 3,
wherein the first ring is disposed above the second protrusion of the second shield, wherein the first ring is configured to be supported by the second protrusion in a first position and by the substrate support in a second position.

5. The substrate processing system of claim 3, further comprising:
one or more biasing elements disposed between the first ledge and the lip of the second shield to allow movement of the second shield such that the chamber lid reaches a complete closed position while providing an upward force in a direction of the chamber lid such that the seal is formed between the first and second shields.

6. The substrate processing system of claim 3, further comprising:
a chamber lid lift assembly coupled to the process chamber and chamber lid to move the chamber lid between the open and closed positions, wherein the chamber lid lift assembly lifts the chamber lid along a central axis of the process chamber sufficient to raise the second end of the first shield to clear an upper end of the chamber wall and rotates the chamber lid about a horizontal axis disposed perpendicularly to a central axis of the process chamber until the chamber lid reaches the open position.

7. The substrate processing system of claim 6, wherein the chamber lid lift assembly further comprises:
a plurality of linear guides coupled to an external side of the chamber wall, wherein each linear guide has one or more guide shafts moveably coupled thereto, wherein each guide shaft is moveable in a direction parallel to the central axis;
a support plate coupled to each guide shaft and moveable therewith;
a plurality of blocks disposed on a guide opposing surface of the support plate;
a rotation shaft moveably coupled to the plurality of blocks such that the rotation shaft rotates about the horizontal axis; and
a plurality of arms, each arm having a first end fixedly coupled to the rotation shaft and having a second end coupled to the chamber lid such that rotation of the rotation shaft causes the chamber lid to rotate about the horizontal axis.

8. The substrate processing system of claim 7, wherein the chamber lid lift assembly further comprises:
a first motor coupled to the rotation shaft to rotate the rotation shaft about the horizontal axis.

9. The substrate processing system of claim 7, wherein the chamber lid lift assembly further comprises:
a threaded shaft;
a lift block movable along the threaded shaft upon rotation of the threaded shaft; and
at least one of:
a hand wheel coupled to the threaded shaft to control the rotation of the threaded shaft such that the chamber lid is raised or lowered with respect to the upper end of the chamber wall; or
a motor coupled to the threaded shaft to control the rotation of the threaded shaft such that the chamber lid is raised or lowered with respect to the upper end of the chamber wall.

* * * * *